United States Patent
Fujinaga et al.

(10) Patent No.: US 9,454,638 B2
(45) Date of Patent: Sep. 27, 2016

(54) MOTOR DESIGN METHOD, MOTOR DESIGNED BY MOTOR DESIGN METHOD, AND ELECTRIC VEHICLE PROVIDED WITH MOTOR

(75) Inventors: Takashi Fujinaga, Tokyo (JP); Yasushi Mitsuyama, Tokyo (JP); Hideki Hashimoto, Tokyo (JP); Shinji Okada, Tokyo (JP)

(73) Assignee: Mitsubishi Heavy Industries, LTD., Tokyo (JP)

( * ) Notice: Subject to any disclaimer, the term of this patent is extended or adjusted under 35 U.S.C. 154(b) by 556 days.

(21) Appl. No.: 13/876,035

(22) PCT Filed: Oct. 19, 2011

(86) PCT No.: PCT/JP2011/074051
§ 371 (c)(1),
(2), (4) Date: Mar. 26, 2013

(87) PCT Pub. No.: WO2012/053551
PCT Pub. Date: Apr. 26, 2012

(65) Prior Publication Data
US 2013/0179133 A1 Jul. 11, 2013

(30) Foreign Application Priority Data
Oct. 19, 2010 (JP) .................... 2010-234860

(51) Int. Cl.
*G06F 7/60* (2006.01)
*G06F 17/10* (2006.01)
(Continued)

(52) U.S. Cl.
CPC ....... *G06F 17/5095* (2013.01); *B60L 15/2045* (2013.01); *B60W 10/08* (2013.01);
(Continued)

(58) Field of Classification Search
CPC ............ G06F 17/5095; B60W 10/08; B60W 2300/10; H02K 15/00; B60L 15/2045; B60L 2200/18; Y02T 10/7283; Y02T 10/641; B60Y 2304/00

USPC ............................................................ 703/2
See application file for complete search history.

(56) References Cited

U.S. PATENT DOCUMENTS 5,804,947 A   9/1998 Nii et al. .................... 322/15
6,401,016 B1 * 6/2002 Yoshino .................. B60K 6/46
                                                    180/65.245
(Continued)

FOREIGN PATENT DOCUMENTS

CN        1642768      7/2005
CN       101738979     6/2010
(Continued)

OTHER PUBLICATIONS

Chinese Office Action issued Nov. 24, 2014 in corresponding Chinese Patent Application No. 201180048954.4 with English translation.
(Continued)

*Primary Examiner* — Dwin M Craig
(74) *Attorney, Agent, or Firm* — Wenderoth, Lind & Ponack, L.L.P.

(57) ABSTRACT

A motor design method, a motor (11) designed by the motor design method, and an electric vehicle (10) provided with the motor (11) include a first calculation step of obtaining a set of a number of revolutions required to achieve a predetermined running pattern and a torque required to achieve the predetermined running pattern, a second calculation step of selecting a motor efficiency corresponding to the number of revolutions and the torque from any one of motor characteristic curves, a third calculation step of obtaining a work amount from the number of revolutions and the torque and obtaining power consumption by dividing the work amount by the motor efficiency, and a fourth calculation step of obtaining a sum of the power consumption by repeating the first calculation step, the second calculation step, and the third calculation step over the entire running time.

4 Claims, 8 Drawing Sheets

(51) Int. Cl.
 *G06F 17/50* (2006.01)
 *B60L 15/20* (2006.01)
 *H02K 15/00* (2006.01)
 *B60W 10/08* (2006.01)

(52) U.S. Cl.
 CPC .......... *H02K 15/00* (2013.01); *B60L 2200/18* (2013.01); *B60W 2300/10* (2013.01); *B60Y 2304/00* (2013.01); *Y02T 10/641* (2013.01); *Y02T 10/645* (2013.01); *Y02T 10/72* (2013.01); *Y02T 10/7283* (2013.01)

(56) References Cited

U.S. PATENT DOCUMENTS

| | | | |
|---|---|---|---|
| 2003/0094816 A1 | 5/2003 | Kazama | 290/40 C |
| 2004/0021437 A1* | 2/2004 | Maslov et al. | 318/254 |
| 2005/0284683 A1* | 12/2005 | Matsuda | 180/242 |
| 2007/0162258 A1* | 7/2007 | Lin et al. | 702/186 |
| 2008/0116759 A1* | 5/2008 | Lin | 310/184 |
| 2009/0118920 A1* | 5/2009 | Heap et al. | 701/54 |
| 2009/0118957 A1* | 5/2009 | Heap et al. | 701/70 |
| 2009/0171554 A1 | 7/2009 | Yaguchi | 701/112 |

FOREIGN PATENT DOCUMENTS

| | | |
|---|---|---|
| JP | 07-046721 | 2/1995 |
| JP | 7-67216 | 3/1995 |
| JP | 7-231505 | 8/1995 |
| JP | 2002-78109 | 3/2002 |
| JP | 2008-143242 | 6/2008 |

OTHER PUBLICATIONS

International Search Report issued Jan. 10, 2012 in International (PCT) Application No. PCT/JP2011/074051 with English translation.

Written Opinion of the International Searching Authority issued Jan. 10, 2012 in International (PCT) Application No. PCT/JP2011/074051 with English translation.

* cited by examiner

MOTOR DESIGN METHOD, MOTOR DESIGNED BY MOTOR DESIGN METHOD, AND ELECTRIC VEHICLE PROVIDED WITH MOTOR

TECHNICAL FIELD

The present invention relates a motor design method that is applied to a full battery type electric driven bus without a charging engine, a motor designed by the motor design method, and an electric vehicle provided with the motor.

Priority is claimed on Japanese Patent Application No. 2010-234860, filed Oct. 19, 2010, the content of which is incorporated herein by reference.

Recently, a type of electric driving, such as in a hybrid system or the like, has been actively introduced into large motor vehicles in addition to cars. In particular, a route bus of a city has an advantage of transporting a large number of passengers, but very frequently accelerates and decelerates while some passengers are standing therein. For this reason, using the electric driving type in which a vehicle is driven with a motor is considered to be optimal in terms of several aspects such as energy saving, acceleration performance, ride comfort and the like.

However, since a motor has characteristics quite different from those of an engine, there is a need to expedite a spread of the electric driving type by reviewing a method for accurately evaluating the power performance or the energy efficiency.

A motor design method controlling a motor so as to maintain a rated temperature, a motor designed by the motor design method, and an electric vehicle provided with the motor have been known in the prior art (for example, see Patent Document 1).

Figure 8:
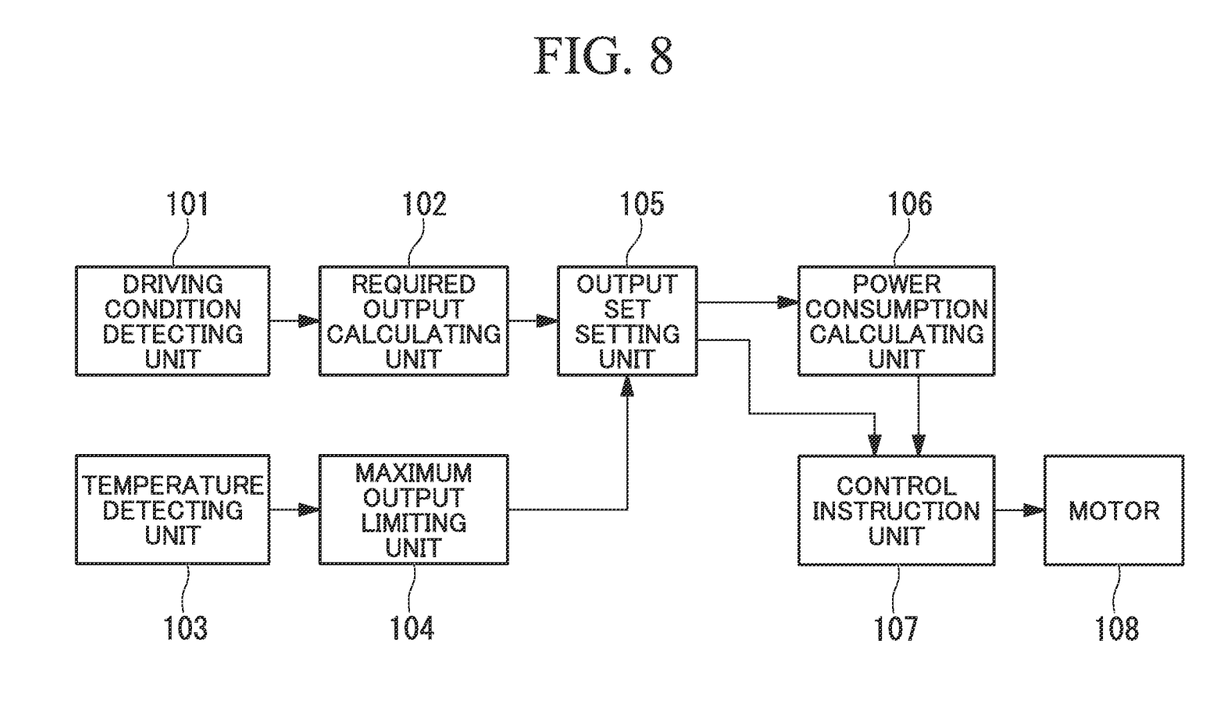
FIG. 8 is a block diagram showing the configuration of a conventional motor design method.

As shown in FIG. 8, in the motor design method, the motor designed by the motor design method, and the electric vehicle provided with the motor that are described in Patent Document 1, a required output for driving is calculated by a required output calculating unit 102 depending on driving conditions detected by a driving condition detecting unit 101. A maximum output limiting unit 104 sets a maximum output which is separately limited according to a temperature of each motor 108 detected by a temperature detecting unit 103. An output set setting unit 105 sets the required output for driving to be a plurality of output sets to be shared by each motor 108 within a range of the maximum output. A power consumption calculating unit 106 calculates whole power consumption for each output set. A control instruction unit 107 outputs control instructions to each motor 108 according to the output set in which the whole power consumption is minimized.

In the motor design method, the motor designed by the motor design method, and the electric vehicle provided with the motor that are described in Patent Document 1, the temperature of each motor 108 is detected. Further, in connection with a motor 108 of which the temperature is increased above a predetermined temperature, the output limits thereof is limited to a range of a continuous rating, and then controls output torque instructions of each motor 108 so that whole power consumption is minimized.

Therefore, in the motor design method, the motor designed by the motor design method, and the electric vehicle provided with the motor that are described in Patent Document 1, the motors 108 are selected so as to maintain a rated temperature optimal for a running pattern in consideration of the rated temperature. To this end, the output of the motors 108 that are continuously driven at an instantaneous rating is reduced to the continuous rating to prevent the motor in advance from being destroyed due to burnout, etc., and generally operate the motor at maximum efficiency. Further, the output of the motors 108 is limited to a range of the continuous rating, and thus the maximum torque is output within the limited range even when the maximum output torque of all the motors is smaller than a required torque for driving. For this reason, the driven is performed also at the maximum efficiency in that state.

PRIOR ART DOCUMENT

Patent Document

[Patent Document 1] Japanese Unexamined Patent Application, First Publication No. H7-46721

SUMMARY OF THE INVENTION

Problems to be Solved by the Invention

However, in the motor design method, the motor designed by the motor design method, and the electric vehicle provided with the motor that are described in the foregoing Patent Document 1, the motors 108 are selected so as to maintain a rated temperature optimal for a running pattern in consideration of the rated temperature.

Therefore, in the motor design method, the motor designed by the motor design method, and the electric vehicle provided with the motor that are described in the foregoing Patent Document 1, the motor efficiency cannot be optimized based on a work amount or the like, and thus there is room to improve the power consumption.

It is an object of the present invention to provide a motor design method capable of improving the power consumption by analyzing a running pattern and setting efficiency maps of the motor so as to minimize a time integration found by dividing a work amount by the motor efficiency, a motor designed by the motor design method, and an electric vehicle provided with the motor.

Means for Solving the Problems

According to a first aspect of the present invention, a motor design method includes:

a first calculation step of obtaining a set of a number of revolutions required to achieve a predetermined running pattern and a torque required to achieve the predetermined running pattern, a second calculation step of selecting a motor efficiency corresponding to the number of revolutions and the torque from any one of motor characteristic curves, a third calculation step of obtaining a work amount from the number of revolutions and the torque and obtaining power consumption by dividing the work amount by the motor efficiency, and a fourth calculation step of obtaining a sum of the power consumption by repeating the first calculation step, the second calculation step, and the third calculation step over the entire running time.

According to a second aspect of the present invention, the motor has characteristics selected in the first calculation step, the second calculation step, the third calculation step, and the fourth calculation step.

According to a third aspect of the present invention, an electric vehicle is provided with the motor designed by the motor design method according to the motor design method.

Advantageous Effects of Invention

According to the motor design method, the motor designed by the motor design method, and the electric vehicle provided with the motor of the aspects of the present invention, it is possible to improve the power consumption by analyzing the running pattern and setting the efficiency maps of the motor so as to minimize the time integration found by dividing the work amount by the motor efficiency.

MODES FOR CARRYING OUT THE INVENTION

Hereinafter, a motor design method, a motor designed by the motor design method, and an electric vehicle provided with the motor according to an embodiment of the present invention will be described with reference to the accompanying drawings.

Figure 1:
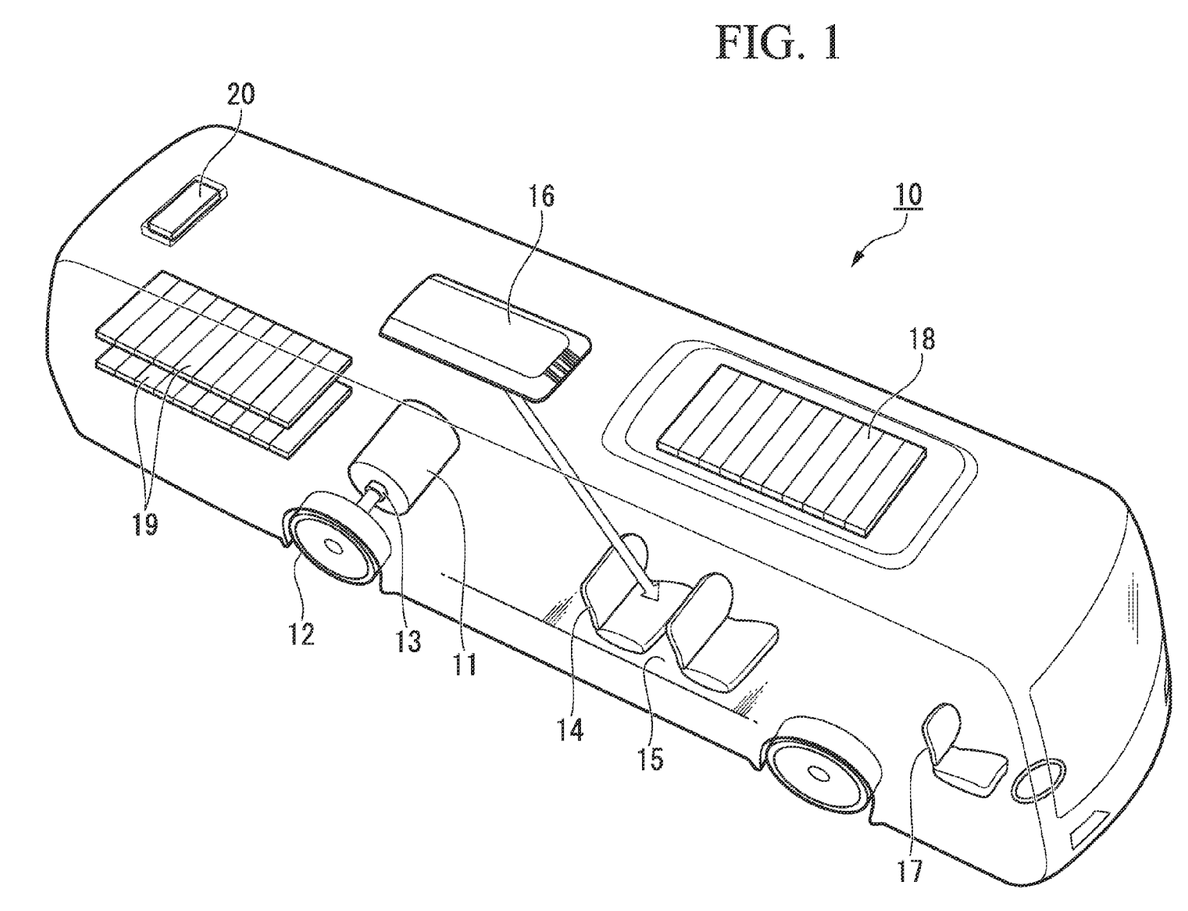
FIG. 1 is a perspective view showing the outer appearance of an electric vehicle provided with a motor of an embodiment according to the present invention.

As shown in FIG. 1, a route bus (an electric vehicle) 10 includes a motor 11 designed by a motor design method according to an embodiment of the present invention. The motor 11 is connected to an axle 13 of a rear wheel 12. The route bus 10 has an air conditioner 16 mounted on a roof surface over a bottom surface 15 on which a plurality of seats 14 are arranged. The route bus 10 is provided with a fixed-type lithium ion secondary battery 18 mounted on the roof of a driver's seat 17 side. The route bus 10 is also provided with an exchangeable lithium ion secondary battery pack 19 and an inverter 20 arranged at a rear portion below the bottom surface 15. Meanwhile, the motor 11 may be an in-wheel motor or the like.

Figure 2:
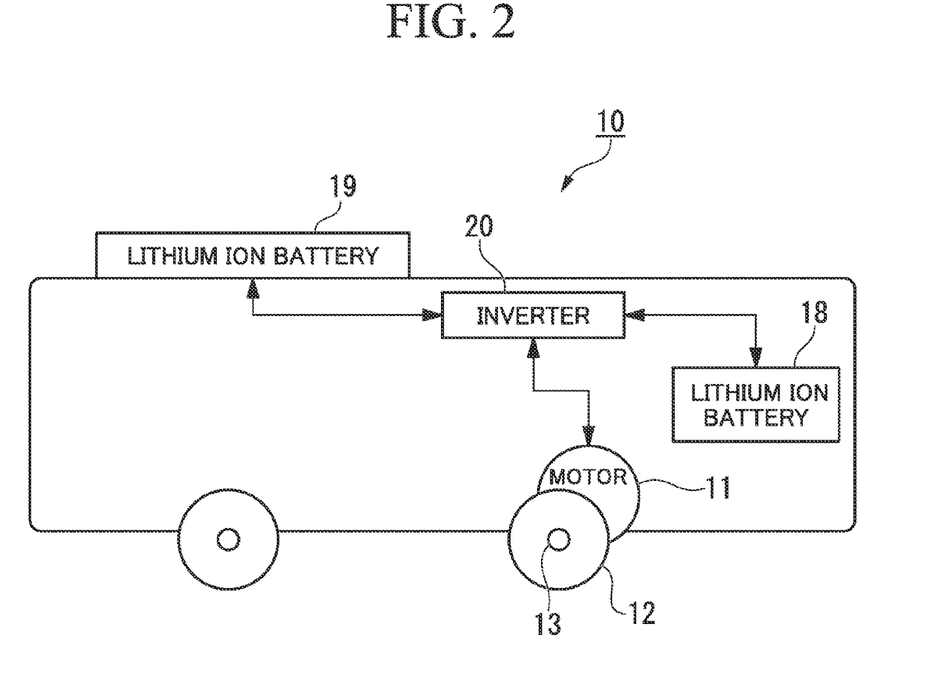
FIG. 2 is a block diagram showing the configuration of the electric vehicle according to an embodiment of the present invention.

As shown in FIG. 2, in the route bus 10, the power supplied from the fixed-type lithium ion secondary battery 18 and the exchangeable lithium ion secondary battery pack 19 is applied through the inverter 20 to control the rotation of the motor 11. When the motor 11 rotates, power is generated by the power generation action according to the rotation of the motor 11, and the power is charged in the fixed-type lithium ion secondary battery 18 and the exchangeable lithium ion secondary battery pack 19 through the inverter 20.

Figure 3:
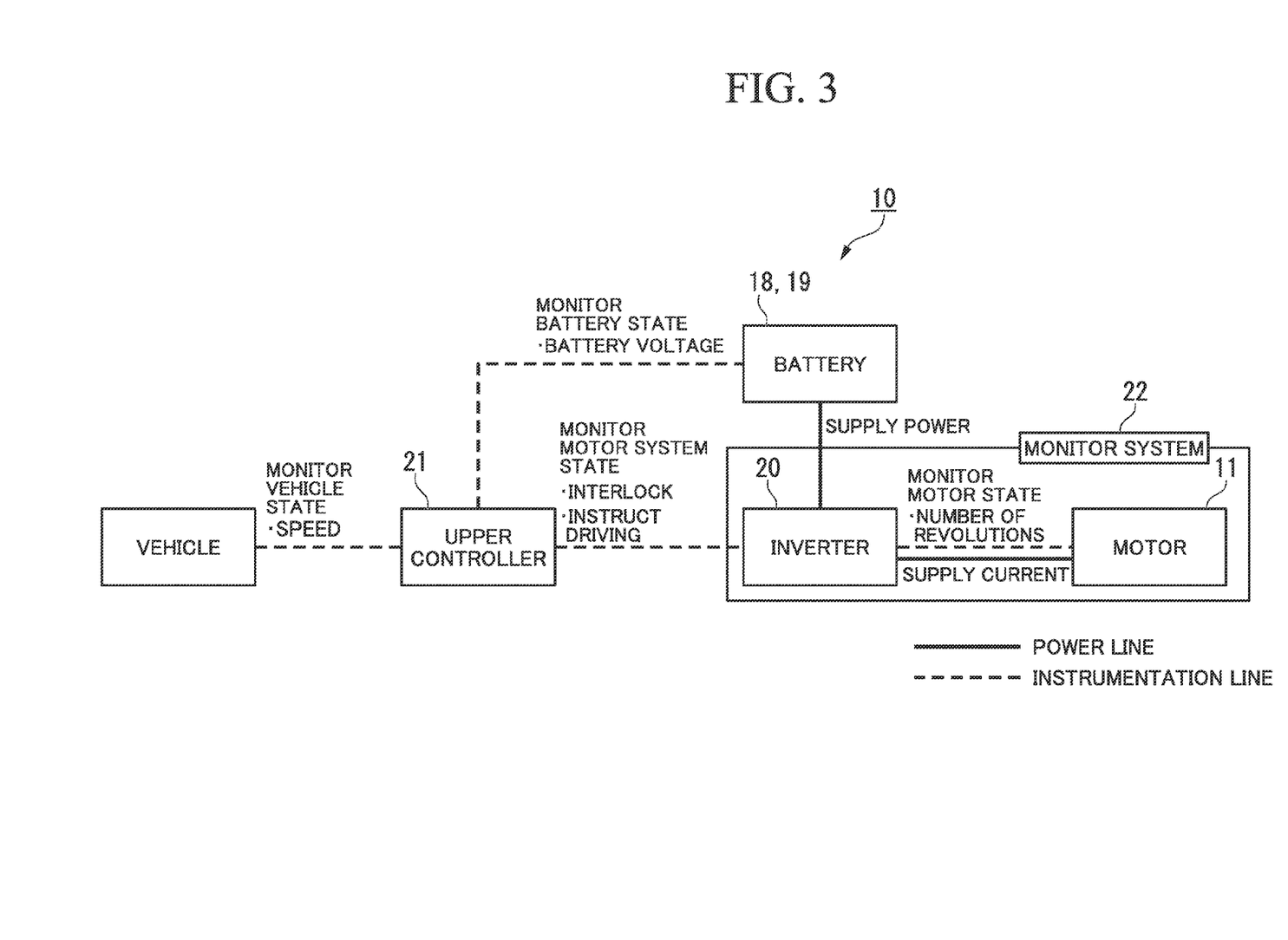
FIG. 3 is a view showing the instrumentation line of the electric vehicle according to an embodiment of the present invention.

As shown in FIG. 3, the route bus 10 further includes an upper controller 21 and a motor system 22 which includes the motor 11 and the inverter 20.

The upper controller 21 monitors the current vehicle speed information of the route bus 10 at all times. The upper controller 21 has an interlock function and a driving instruction function electrically connected to a console such as an accelerator pedal that is operated by a driver. The upper controller 21 transmits electrical signals of the interlock function and the driving instruction function to the inverter 20.

The inverter 20 controls a number of revolutions of the motor 11 according to a current supply to the motor 11, based on control of power supplied from the fixed-type lithium ion secondary battery 18 and the exchangeable lithium ion secondary battery pack 19. In this case, the inverter 20 monitors the number of revolutions of the motor 11 at all times.

Next, the running pattern applied to the motor design method will be described. In this case, as the route bus 10, a running pattern extracted from a measured value such as an M15 mode or the like, that is a representative running pattern of a large motor vehicle is shown.

Figure 4:
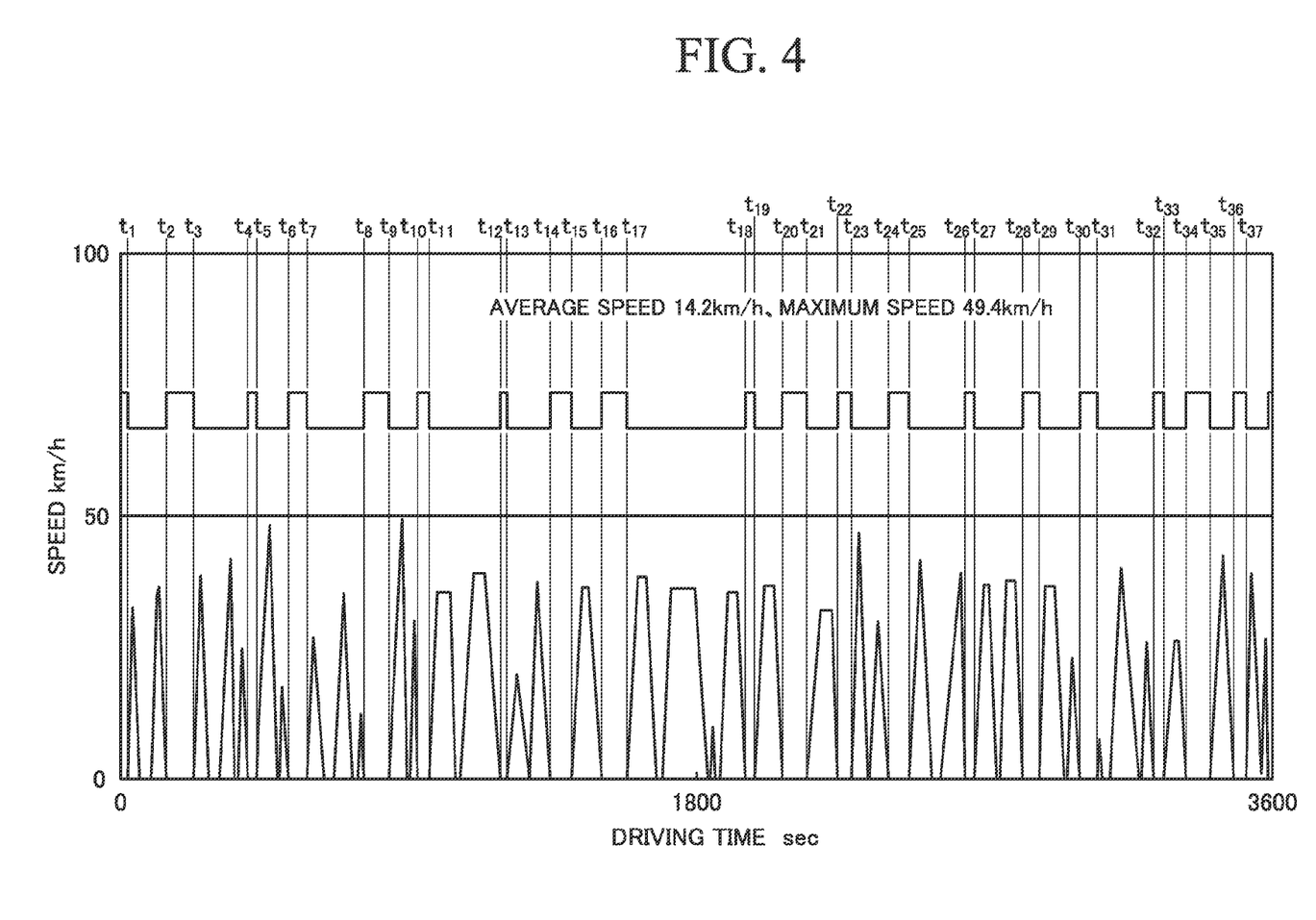
FIG. 4 shows a speed profile of an example of the running pattern applied to a motor design method according to an embodiment of the present invention.

As shown in FIG. 4, the route bus 10 starts driving from timing t1 within one hour (3600 seconds) from timing t1 to timing t37 and stops at a bus station or according to a signal at timing t2 after acceleration, coasting, and deceleration. The route bus 10 stops in the time between timing t2 and timing t3, starts driving from timing t3, and stops at a bus station or according to a signal at timing t4 after acceleration, coasting, and deceleration. The route bus 10 stops in the time between timing t4 and timing t5, starts driving from timing t5, and stops at a bus station or according to a signal at timing t6 after acceleration, coasting, and deceleration.

The route bus 10 stops in the time between timing t6 and timing t7, starts driving from timing t7, and stops at a bus station or according to a signal at timing t8 after acceleration, coasting, and deceleration. The route bus 10 stops in the time between timing t8 and timing t9, starts driving from timing t9, and stops at a bus station or according to a signal at timing t10 after acceleration, coasting, and deceleration. The route bus 10 stops in the time between timing t10 and timing t11, starts driving from timing t11, and stops at a bus station or according to a signal at timing t12 after acceleration, coasting, and deceleration. The route bus 10 stops in the time between timing t12 and timing t13, starts driving from timing t13, and stops at a bus station or according to a signal at timing t14 after acceleration, coasting, and deceleration.

The route bus 10 stops in the time between timing t14 and timing t15, starts driving from timing t15, and stops at a bus station or according to a signal at timing t16 after acceleration, coasting, and deceleration. The route bus 10 stops in the time between timing t16 and timing t17, starts driving from timing t17, and stops at a bus station or according to a signal at timing t18 after acceleration, coasting, and deceleration. The route bus 10 stops in the time between timing t18 and timing t19, starts driving from timing t19, and stops at a bus station or according to a signal at timing t20 after acceleration, coasting, and deceleration. The route bus 10 stops in the time between timing t20 and timing t21, starts driving from timing t21, and stops at a bus station or according to a signal at timing t22 after acceleration, coasting, and deceleration.

The route bus 10 stops in the time between timing t22 and timing t23, starts driving from timing t23, and stops at a bus station or according to a signal at timing t24 after acceleration, coasting, and deceleration. The route bus 10 stops in the time between timing t24 and timing t25, starts driving from timing t25, and stops at a bus station or according to a signal at timing t26 after acceleration, coasting, and deceleration. The route bus 10 stops in the time between timing t26 and timing t27, starts driving from timing t27, and stops at a bus station or according to a signal at timing t28 after acceleration, coasting, and deceleration. The route bus 10 stops in the time between timing t28 and timing t29, starts driving from timing t29, and stops at a bus station or according to a signal at timing t30 after acceleration, coasting, and deceleration.

The route bus 10 stops in the time between timing t30 and timing t31, starts driving from timing t31, and stops at a bus station or according to a signal at timing t32 after acceleration, coasting, and deceleration. The route bus 10 stops in the time between timing t32 and timing t33, starts driving from timing t33, and stops at a bus station or according to a signal at timing t34 after acceleration, coasting, and deceleration. The route bus 10 stops in the time between timing t34 and timing t35, starts driving from timing t35, and stops at a bus station or according to a signal at timing t36 after acceleration, coasting, and deceleration. The route bus 10 stops in the time between timing t36 and timing t37, and it takes one hour for driving from timing t37.

It has been proved by the measurement of the running pattern that an average speed of the route bus 10 is 14.2 km/h and a maximum speed thereof is 48.4 km/h, within one hour from timing t1 to timing t37.

Next, in a combination of any driving force (torque) and a vehicle speed (the number of revolutions) on a two-dimensional plane based on necessary energy for driving measured by the running pattern obtained from FIG. 4, the work amount (shown in a height direction in FIG. 5) for which the route bus 10 is required will be described.

Figure 5:
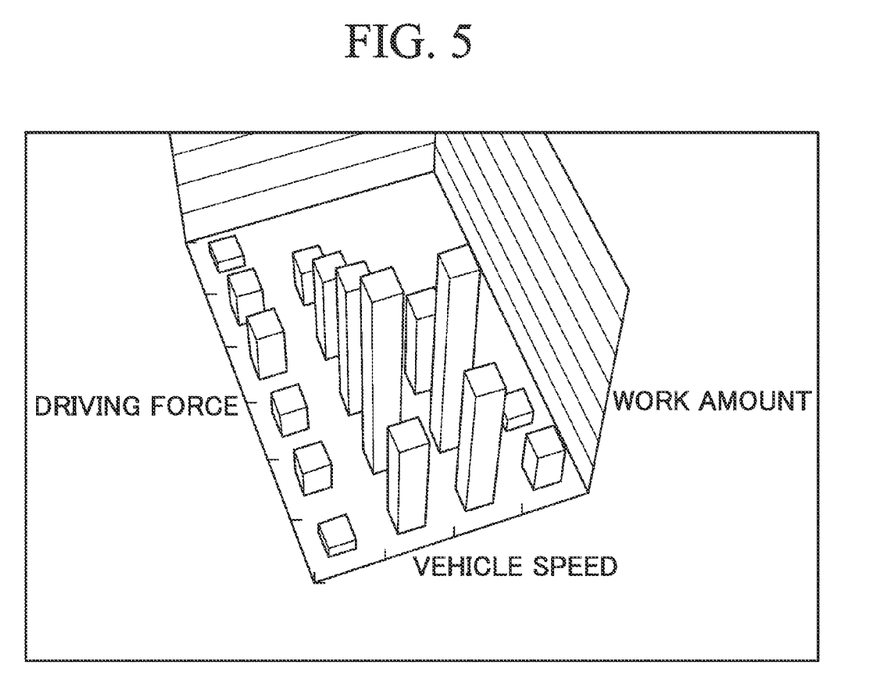
FIG. 5 is a view showing the distribution of work amount of the electric vehicle applied to the motor design method according to an embodiment of the present invention.

As shown in FIG. 5, the number of revolutions of the route bus 10 is unambiguously determined based on the vehicle speed and the torque thereof is determined based on the acceleration and deceleration state according to the driving state defined by the running pattern shown in FIG. 4.

Next, the efficiency in connection with any torque and the number of revolutions will be described.

Figure 6:
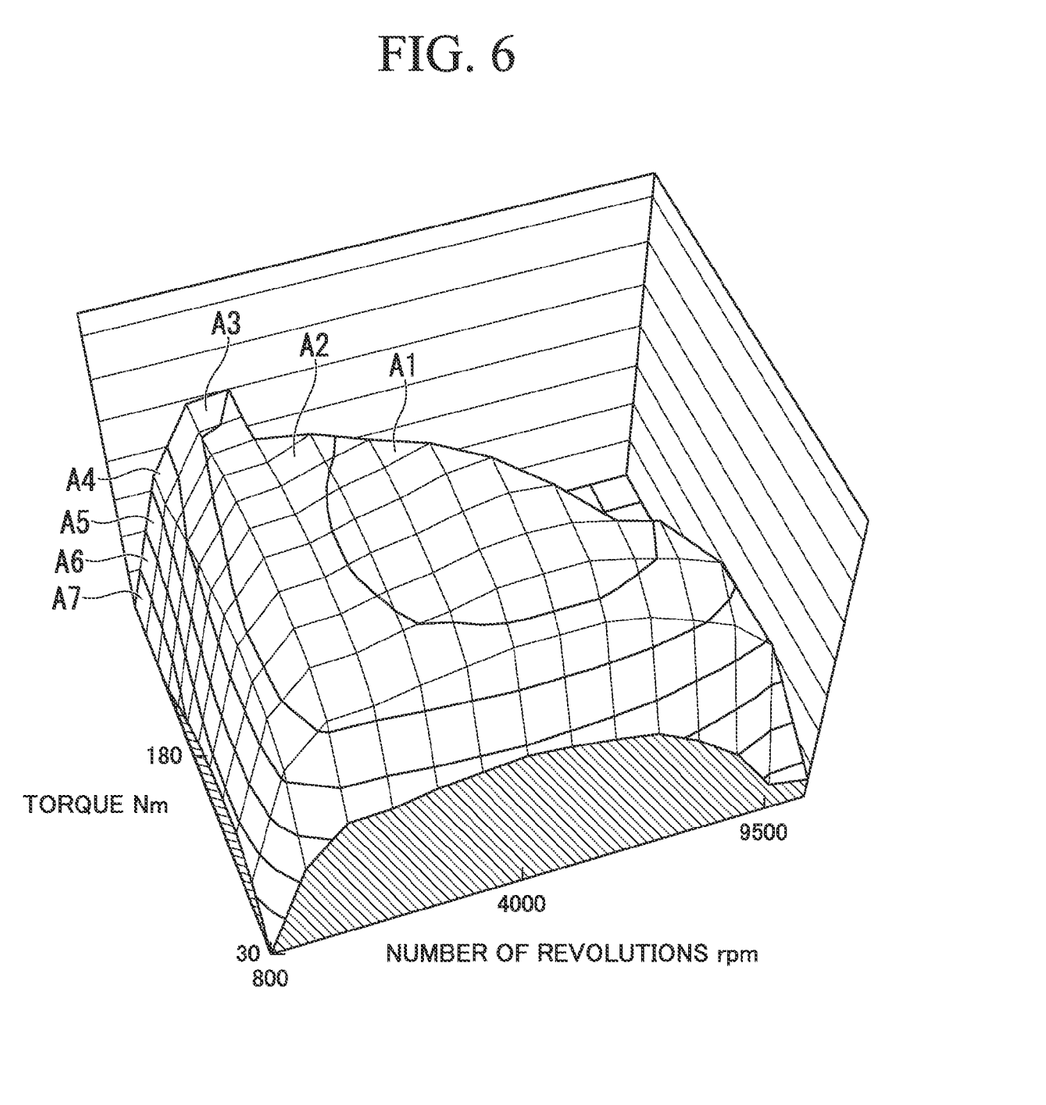
FIG. 6 shows an efficiency map of the motor applied to the motor design method according to an embodiment of the present invention.

As shown in FIG. 6, efficiency regions are set in an order of a first efficiency region A1, a second efficiency region A2, a third efficiency region A3, a fourth efficiency region A4, a fifth efficiency region A5, a sixth efficiency region A6, and a seventh efficiency region A7 from the top to the bottom. Therefore, the efficiency in any torque and the number of revolutions is reduced in order of the first efficiency region A1, the second efficiency region A2, the third efficiency region A3, the fourth efficiency region A4, the fifth efficiency region A5, the sixth efficiency region A6, and the seventh efficiency region A7.

The motor design method according to the embodiment of the present invention is a method for setting, as an appropriate motor 11, the motor 11 in which a value obtained by dividing the work amount by the efficiency and adding it in each timing t1 to t37 (t1 to tn) of driving characteristics of the running pattern shown in FIG. 4 is small, in connection with the motor 11 having various characteristics shown in FIG. 6.

The motor design method according to the embodiment of the present invention includes a first calculation step of obtaining a set of the number of revolutions N required to achieve a predetermined running pattern and a torque T required to achieve the predetermined running pattern, a second calculation step of selecting the motor efficiency αt corresponding to the number of revolutions N and the torque T from any one of motor characteristic curves, a third calculation step of obtaining the work amount W from the number of revolutions N and the torque T and obtaining the power consumption by dividing the work amount W by the motor efficiency αt, and a fourth calculation step of obtaining a sum of the power consumption by repeating the first calculation step, the second calculation step, and the third calculation step over the entire running time.

Next, an order of the calculations of the motor design method will be described.

Figure 7:
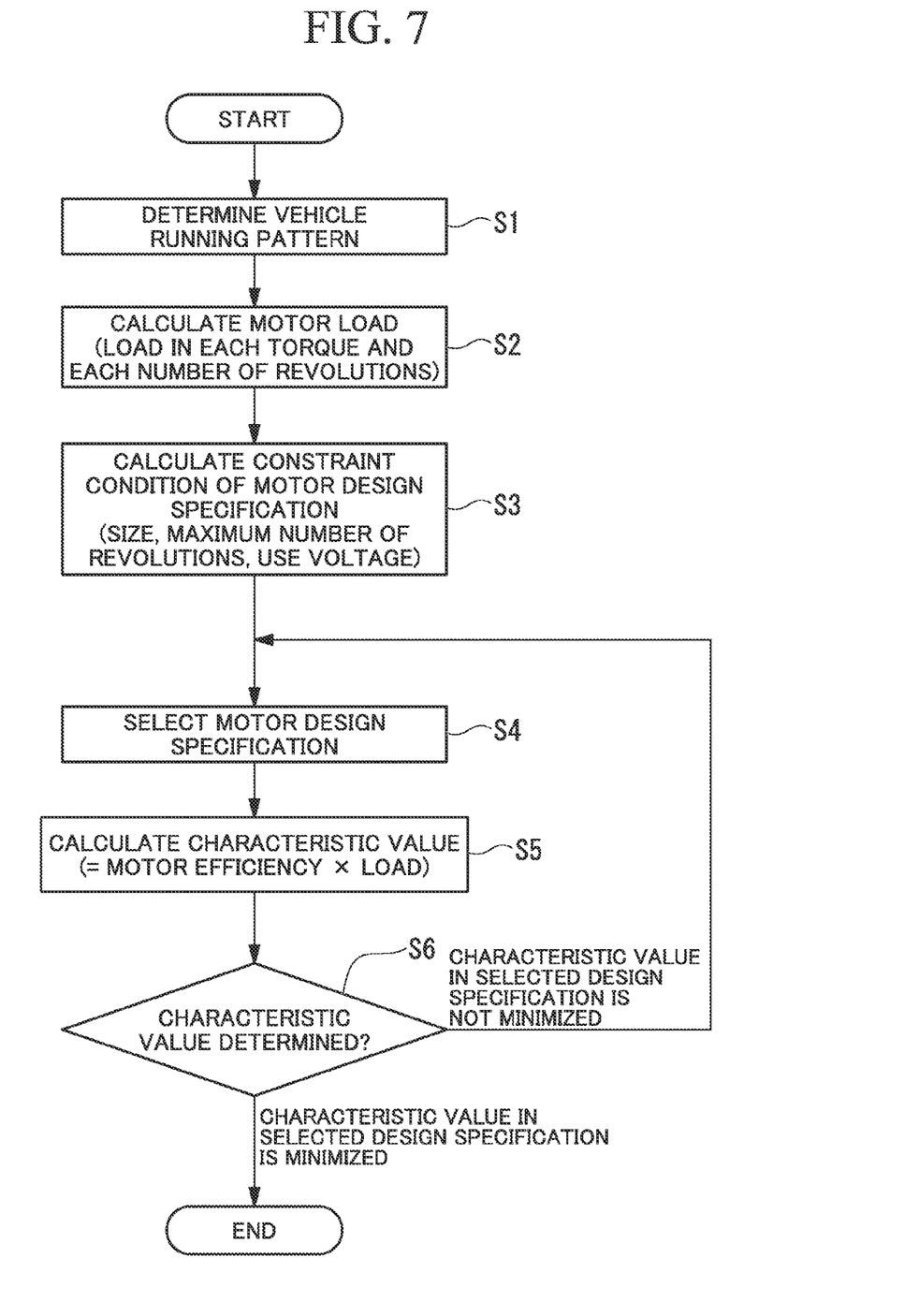
FIG. 7 is a flow chart for design applied to the motor design method according to an embodiment of the present invention.

As shown in FIG. 7, first, the number of revolutions N required to achieve the predetermined running pattern and the predetermined running pattern are determined (S1).

Next, a motor load is calculated based on a load in connection with the torque or each number of revolutions of the motor (S2).

Next, constraint conditions of motor design specifications such as the size, the maximum number of revolutions, and the use voltage of the motor are calculated (S3).

Further, the motor design specifications are selected (S4).

Next, the characteristic values are calculated by calculating the motor efficiency αt×load based on the selected motor design specifications (S5).

Further, the characteristic values are set (S6).

In this regard, when the characteristic values in the selected design specifications are not minimized, the selection of the motor design specifications and the calculation of the characteristic values are repeated (S4→S5→S6).

That is, the work amount of the route bus 10 in the predetermined timing t to t+Δt is calculated by the following Equation 1.

$$\Delta Wt = 2\pi NT\Delta t \qquad \text{[Equation 1]}$$

In this case, the number of revolutions N and the torque T of the motor 11 are set to be Nt and Tt.

Therefore, the efficiency becomes αt in this case.

In this case, the motor power consumption ΔWmt is calculated by the following Equation 2.

$$\Delta Wmt = \Delta Wt/\alpha t = 2\pi NT\Delta t/\alpha t \qquad \text{[Equation 2]}$$

Further, these are time-integrated to generate the following Equation 3.

$$Wmt = \Sigma \Delta Wmt = \Sigma \Delta Wt/\alpha t = \Sigma 2\pi NT\Delta t/\alpha t \qquad \text{[Equation 3]}$$

Further, the efficiency maps of the motor 11 are set to minimize the time integration and in the fourth calculation step, the first calculation step, the second calculation step, and the third calculation step are repeated over the entire running timing to obtain the sum of the power consumption.

As described above, according to the motor design method of the present embodiment, the power consumption can be improved by analyzing the running pattern and setting the efficiency maps of the motor 11 so as to minimize the time integration found by dividing the work amount W by the motor efficiency αt.

According to the motor 11 of the present embodiment, the motor can be designed by analyzing the running pattern so as to minimize the time integration found by dividing the work amount W by the motor efficiency αt.

According to the route bus 10 of the present embodiment, the power consumption can be improved by analyzing the running pattern and setting the efficiency maps of the motor 11 so as to minimize the time integration found by dividing the work amount W by the motor efficiency αt. Therefore, according to the route bus 10 of the present embodiment, the electric driving type of driving the vehicle with the motor 11 is adopted and the optimal electric vehicle in terms of several aspects such as energy saving, acceleration performance, and ride comfort can be provided.

In the present embodiment, even though the efficiency maps of the motor are set so as to minimize the time integration found by dividing the work amount by the motor efficiency, it is actually difficult to select the minimized one of the efficiency maps from infinite information. Therefore, for example, the minimized one of the plurality of efficiency maps which is restricted may be selected. When computer programs or the like is used, the efficiency map of the motor may be selected when it converges on any threshold value or less.

In other words, the embodiment of the present invention provides the motor design method in which the time integration found by dividing the work amount obtained from the running pattern by the motor efficiency is made smaller.

Further, in the motor design method, the motor 11 designed by the motor design method, and the route bus 10 provided with the motor 11 according to the embodiment of the present invention, the air conditioner 16, the fixed-type lithium ion secondary battery 18, the exchangeable lithium secondary battery pack 19, the inverter 20 or the like, are not limited to the foregoing embodiment. Therefore, the embodiment of the present invention can be appropriately modified, improved or the like.

INDUSTRIAL APPLICABILITY

The present invention can be applied to the full battery type electric driven bus without a charging engine, and in particular, is appropriate for providing the optimal electric vehicle in terms of several aspects such as energy saving, acceleration performance, ride comfort and the like.

DESCRIPTION OF REFERENCE NUMERALS

10: route bus (electric vehicle)
11: motor

The invention claimed is:

1. A motor design method implemented using a computer processing to design a motor dedicated to an electric vehicle, the motor design method comprising:
    measuring and analyzing a running pattern of the electric vehicle;
    calculating a set of a number of revolutions and a torque according to the running pattern of the electric vehicle;
    determining a motor efficiency corresponding to the number of revolutions and the torque with reference to a specification of the motor;
    calculating a work amount based on the number of revolutions and the torque;
    calculating power consumption by dividing the work amount by the motor efficiency;
    producing a sum of the power consumption over an entire running time of the electric vehicle;
    setting a motor efficiency map, representing the motor efficiency in connection with the number of revolutions and the torque, with the sum of the power consumption minimized; and
    designing the motor with reference to the motor efficiency map.

2. A motor designed by the motor design method according to claim 1.

3. An electric vehicle including a motor adapted to a running pattern which is measured and analyzed in advance, the motor being designed according to a motor design method comprising:
    calculating a set of a number of revolutions and a torque according to the running pattern;
    determining a motor efficiency corresponding to the number of revolutions and the torque with reference to a specification of the motor;
    calculating a work amount based on the number of revolutions and the torque;
    calculating power consumption by dividing the work amount by the motor efficiency;
    producing a sum of the power consumption over an entire running time of the electric vehicle;
    setting a motor efficiency map, representing the motor efficiency in connection with the number of revolutions and the torque, with the sum of the power consumption minimized; and
    designing the motor with reference to the motor efficiency map.

4. An electric vehicle comprising:
    a battery;
    a motor system including a motor and an invertor electrically driven by the battery; and
    a controller configured to monitor the battery and the motor system, thus measuring a running pattern,
    wherein the motor is designed to operate with reference to a motor efficiency map which is set through:
        calculating a set of a number of revolutions and a torque according to the running pattern;
        determining a motor efficiency corresponding to the number of revolutions and the torque with reference to a specification of the motor;
        calculating a work amount based on the number of revolutions and the torque;
        calculating power consumption by dividing the work amount by the motor efficiency;
        producing a sum of the power consumption over an entire running time of the electric vehicle; and
        setting the motor efficiency map, representing the motor efficiency in connection with the number of revolutions and the torque, with the sum of the power consumption minimized.

* * * * *